United States Patent [19]
Audaire et al.

[11] 4,054,864
[45] Oct. 18, 1977

[54] METHOD AND DEVICE FOR THE STORAGE OF ANALOG SIGNALS

[75] Inventors: Luc Audaire, St-Nizier-du-Moucherotte; Joseph Borel, Echirolles; Vincent Le Goascoz, Claix; Robert Poujois, Grenoble, all of France

[73] Assignee: Commissariat a l'Energie Atomique, Paris, France

[21] Appl. No.: 613,375

[22] Filed: Sept. 15, 1975

Related U.S. Application Data

[62] Division of Ser. No. 464,879, April 29, 1974, Pat. No. 3,956,624.

[30] Foreign Application Priority Data

May 4, 1973 France .............................. 73.16246

[51] Int. Cl.² .................... G11C 27/00; G11C 11/40
[52] U.S. Cl. ................................ 340/173 R; 307/360; 307/238
[58] Field of Search ................... 340/173 R; 307/238, 307/235 N, 304

[56] References Cited

U.S. PATENT DOCUMENTS 3,860,916  1/1975  Tarui et al. ...................... 340/173 R

OTHER PUBLICATIONS

Freiman, Variable Threshold Error Correction, IBM Technical Disclosure Bulletin, vol. 4, No. 7, Dec. 1961, p. 102.

Aboaf, Thin Films Based on Al₂O₃, IBM Technical Disclosure Bulletin, vol. 12, No. 11, Apr. 1970, p. 1836.

Primary Examiner—Stuart N. Hecker
Attorney, Agent, or Firm—Sughrue, Rothwell, Mion, Zinn and Macpeak

[57]  ABSTRACT

In a method and a device for storing analog signals in integrated circuit elements, the memory elements are constituted by field-effect transistors having a number of layers of different dielectrics between the gate and the doped semiconductor substrate of the transistor. After discrete sampling of the analog signal has been performed at N points, the N amplitudes corresponding to the N points are stored in N transistors in the form of a threshold voltage.

1 Claim, 3 Drawing Figures

METHOD AND DEVICE FOR THE STORAGE OF ANALOG SIGNALS

This is a division of application Ser. No. 464,879, filed Apr. 29, 1974, now U.S. Pat. No. 3,956,624.

This invention relates to a method and a device for storing analog signals. Said method and device find an advantageous application especially for the purpose of improving an analog signal multiplier. This storage of analog signals permits the possibility of reading previously written data directly in analog form in order to combine said data for the purpose of performing various multiplication operations or alternatively in order to integrate in time an analog signal whose amplitude varies with time.

It is known that, in a transistor of the MOS type having a single layer of insulating oxide between the control gate and the semiconductor substrate, the threshold voltage $V_S$ to be applied to the gate in order that the current should pass between the drain and the source is a technological phenomenon which is difficult to control. This limiting voltage or threshold voltage varies at different points of the surface of a given integrated circuit. In the case of an MOS transistor having a n-type doped silicon substrate, for example, said threshold voltage arises from the presence of fixed positive ionized centers which are occluded in the oxide of the insulator; these charges draw to the surface a layer of negative carriers and the formation of the inversion channel between the drain and the source which are both doped with p-type impurities presupposes that the gate voltage is sufficiently negative to have caused these excess negative carriers to have been driven back into the substrate and to have drawn a layer of p-type carriers to the surface. Whereas the quantity of occluded charges is determined by the fabrication process and is consequently difficult to control in MOS transistors, the multiple dielectric-layer structure of the MIIS type serves to control the trapped charge within the insulator both in sign and in quantity by application of an electric drive.

The present invention is precisely directed to a method for storing analog signals in integrated circuit elements, characterized in that the memory elements are constituted by field-effect transistors having a number of different layers of dielectrics between the gate and the doped semiconductor substrate of the transistor and that, after having performed a discrete sampling of the analog signal at N points, the N amplitudes corresponding to the N points are stored in the form of a threshold voltage in N of said transistors.

In a transistor of the MIIS type, that is to say having multiple dielectric layers, a sufficiently high positive or negative gate voltage induces high fields in the dielectrics and produces currents therein. These currents are different within the different insulators and there is a build-up of charges at the interface between two insulators where there exist centers which are capable of fixing the p-type or n-type carriers for periods of time which vary between a few weeks and a few years depending on the thickness of oxide.

The stored charges modify the threshold voltage of the transistor in a permanent manner; in the case of a n-type doped substrate with p-type regions, the variation in said threshold voltage is positive if the balance of charges is electrically negative and negative if the balance is positive; this corresponds to positive and negative voltages respectively which are applied to the gate for writing of the memory. The voltages which have just been mentioned are known respectively as trapping and untrapping voltages. The quantity of charges stored varies continuously as a function of the amplitude of the writing voltage and of the time during which this latter is applied. In respect of a given writing time, the threshold voltage is proportional to the writing voltage and to the writing duration within an amplitude-duration range which depends on the structure formed. The present Applicant has made use of this property for the storage of analog signals. The technological construction of MIIS units has been proposed up to the present time only for the storage of digital data corresponding to use in systems which are capable of assuming only two distinct physical states usually designated as "0" and "1". The formation of these analog memory cores for the purpose of fixing the information contained in a cell of a capacitive-storage memory is described in the present invention in which it is employed in an analog multiplier and in an analog integrator.

In accordance with the invention, the information is recorded in each element of the memory by applying a writing voltage having a value which is proportional to that of one point of the signal to be recorded between the gate and the inversion channel of the multiple insulatinglayer transistor which constitutes said memory element during a time interval determined by the electrical and technological characteristics of the transistor, the drain and the source of the transistor being isolated during the writing operation, and said writing voltage is read by means of the value of the threshold voltage related thereto in accordance with a law which is determined by the characteristics of said transistor.

The information can be written in the form of a writing voltage between the gate and the inversion channel in two ways, always after having isolated the transistor from the continuous-polarization sources: either by connecting one of the p-regions to a capacitive memory which biases said region and by applying a "writing order" pulse to the transistor gate, or by connecting the gate to a capacitive memory which biases the gate and by applying a "writing order" pulse to one of the p-regions.

The method according to the invention is further characterized in that the threshold voltage is read by applying a known gate voltage to the transistor and by measuring the current which flows within the transistor. Said current is a known linear function of the threshold voltage when the transistor is biased in the so-called "ohmic" region and it is a quadratic function of said threshold voltage when the transistor is biased in the socalled "saturated" region. In the case just mentioned, it is nevertheless possible in the so-called "small signals" approximation and about a given operating point to consider once again that the current is a linear function of the variation in the threshold voltage. The transistor which constitutes the memory element can be of the metal-insulator-insulator semiconductor type in which the two insulators may for example be a layer of silicon dioxide and a layer of nitride. In accordance with the invention and prior to applying the writing voltage to the gate of the MIIS transistor, a calibrated pulse is transmitted to said gate for zero resetting of the memory.

In an alternative embodiment of the invention, no zero-reset pulse is transmitted between the applications of two successive samples of an analog signal; all the samples of a signal which varies in time are added and this is tantamount to integrating said signal with respect to time. The method of integration of analog signals is characterized in that the amplitudes corresponding to N successive sampling points of an analog signal are stored in one transistor in the form of successive additions to the threshold voltage and the resultant threshold voltage which is the result of the integration is then read.

The method of storage in accordance with the invention is of considerable usefulness for the purpose of carrying out operations on analog signals. It is in fact known that digital computers have long been capable of performing the calculation of convolution functions; these functions are of the form:

$$S(n) = \sum_{i=0}^{N} e(n - i) h(i)$$

where $e(n-i)$ is the sample of index $n-i$ of the function $e$, and where $h(i)$ is the sample of index $i$ of the function $h$. The function S is designated as the response function since it is the measured response which corresponds to a signal $e$ when this latter is transmitted through a filter having an transfer function $h$. The sampling operation which is denoted by the index $i$ can be carried out either in time or in space. In many cases, the response of the filter can be determined beforehand and it is found necessary to process many signal functions $e$ in order to obtain the response S after passage within the instrument of the function, namely for a number of different values of the deviation N between the origin of the samplings in the case of both functions. In order to perform the N multiplications and to obtain the sum of the results of these multiplications, it is necessary in the case of computation in a digital computer to provide a chain of three devices, namely an analog-to-digital converter, a digital computation unit and a digital-analog converter. These three operations are tedious and costly in the case of frequent calculations such as the sums of products. In the category of sums of products, there can be listed especially although not exclusively the products of convolution from filtering functions, the measurement of correlations between two signals, discrete Fourier transforms and transforms on orthogonal bases other than Fourier transforms. It is desirable to have the possiblity of performing these operations in analog form with integrated circuits directly on measuring instruments and in real time. To this end, the invention is also directed to a method of term by term multiplication of two ordered series of N terms derived from the sampling of two functions, characterized in that a multiplication of two corresponding terms is performed by recording a voltage which is proportional to one of the terms in a memory of the MIIS transistor type, by applying a given voltage to the gate of said MIIS transistor and by applying a voltage which is proportional to the other term to the gate of at least one MIIS transistor, thus making it possible to obtain a signal which is a linear function of the product of the two signals as will be described hereinafter.

In accordance with the invention, a distinction is drawn between three families of methods for the purpose of obtaining the signal which is a linear function of the product of the two signals. The first two families correspond to four different uses of one and the same basic circuit comprising an MIIS transistor and an MIS transistor in series between two points, one of the points being brought to ground potential and the other point being brought to a supply potential.

In the first family, one of the input signals is introduced in the form of current whilst the other is introduced in the form of a variable resistance, with the result that the product of the two signals is represented by a voltage across the terminals of said resistance through which said current flows.

In the first alternative form of said first family of methods, the first signal is recorded in the form of a threshold voltage on the MIIS transistor which is biased in such a manner as to operate in the saturation region, the second signal is applied to the gate of the MIS transistor which is biased in such a manner as to operate in the ohmic region; at the time of application of a bias voltage to its gate, the MIIS transistor generates a current which is a linear function of the first signal (within the approximation of the small signals) within a resistance which is in turn a linear function of the second signal (resistance formed by the MIS transistor); from this it follows that the voltage of the common point of the two transistors is a linear function of the product.

In the second alternative form of said first family of methods, the signals are applied in the same manner but the MIIS transistor is biased in such a manner as to operate in the ohmic region and the MIS transistor is biased in such a manner as to operate within the saturation region; the MIS transistor produces a current which is a linear function of the second signal (within the approximation of the small signals) within a resistance which is that of the MIIS transistor, said resistance being a linear function of the first signal, with the result that the voltage at the common point of the two transistors is a linear function of the product.

In the second family of methods, one of the two signals is introduced in the form of a voltage whilst the other is introduced in the form of a conductance, with the result that the product is obtained in the form of a current; the conductance is that of the MIS transistor or of the MIIS transistor which operates in the ohmic region and is connected as a "follower source", the gate of the MIIS transistor being accordingly driven by a fixed bias voltage.

In the first method of said second family, the first signal is recorded in the form of a threshold voltage in the MIIS transistor which is biased in such a manner as to operate in the ohmic region and the second signal is applied to the gate of the MIS transistor which is biased in such a manner as to operate in the saturation region. In accordance with the properties of the "follower source" circuit arrangement, the voltage at the common point of the two transistors is equal to the gate voltage of the MIS transistor and therefore to the second signal; the current which flows within the MIIS transistor or so-called "load" transistor is equal to the product of the conductance of the MIIS transistor and the voltage at the terminals of this latter and therefore to the product of the first signal and the second signal.

In the second method of the second family, the signals are applied in the same manner but the MIIS transistor is biased in the saturation region and the MIS transistor is biased in the ohmic region. The voltage at the common point of the two transistors is a linear function of the threshold voltage of the MIIS transistor and therefore a linear function of the first signal and the conductance of the MIS transistor is a linear function of the second signal; the current which flows within the MIS load transistor is then a linear function of the product of the first and of the second signal.

In the third family of methods for obtaining a signal which is equal to the product of two signals, the first signal is recorded in the form of a threshold voltage in the MIIS transistor and the second signal is recorded in the form of a modulation of the two conductances of two MIS transistors. The MIIS transistor operates as a generator for producing current which is proportional to the first signal; it is often preferable to associate with said generator an additional MIS load transistor for ensuring linearization of said current generator. The current delivered is divided between the two conductances of the two MIS transistors, the gate voltages of which are obtained by symmetrical modulation about an identical mean voltage, namely an amplitude modulation which is proportional to the second signal. The difference between the currents flowing within each arm is a linear function of the product of the two signals. The method of term by term multiplication of two series of signals and of addition of all the results of each multiplication is carried out by multiplying the two signals as before and by adding the signals obtained in the case of each multiplication. In this application, it is found preferable to adopt the two methods of the second family as described earlier which deliver a signal produced in the form of a current or of a difference in current. To summarize it may be stated that a number N of multipliers placed in parallel makes it possible after adding the results obtained by each of these latter to obtain the product of convolution of two functions.

The invention is also directed to a device for carrying out the method aforesaid, characterized in that it comprises:

a first capacitive circulation chain C1 in which provision is made in each element for a capacitor whose charge provides a measurement of the information contained in the memory element of said chain, N field-effect transistors T1 having multiple dielectric layers onto which the N items of information written on the chain C1 are transferred in the form of writing voltage, a clock for controlling the transfer of information from the memory elements of the chain C1 to the N transistors T1, N transistors T2 each placed in series with a transistor T1, said transistors T2 being intended to operate in the ohmic region and to form a source feedback for the transistors T1 which are in operation so as to linearize the current-voltage characteristic of said transistors T1, a clock for applying voltage to the N transistors T1 after the writing operation, in which case the current flowing between the drain and source of said transistor is a linear function of the threshold voltage which is recorded on each transistor T1, a second capacitive circulation chain C2 in which the charge defect in each of the capacitors of the N elements is proportional to the recorded information, the voltage at the terminals of the capacitors of said N elements being applied by means of a clock for controlling the transfer to the N gates of N field-effect transistors T3 which operate in the ohmic region, a circuit of known type for adding the currents delivered by each transistor T3 placed in series with a transistor T1 in operation, the addition of the N currents delivered by the N transistors T3 being intended to produce the final signal.

The samples of the functions to be multiplied are introduced into charge-coupled memory chains designated by the references C1 and C2. These memories of known type (as disclosed, for example, in French Pat. No. 7101182) are dynamic memories, that is to say in which the transfer of information is carried out from one element to another by means of a given clock signal. These memory devices have a high speed and high capacity but suffer from a disadvantage in that they hold the information over only a limited period of time. The present invention makes it possible to associate with each element of these chargecoupled memory devices and more particularly with a brigade bucket device a permanent analog memory core which is capable of being re-written after zero-resetting and makes use of a transistor of the multiple dielectric layer type.

In an alternative embodiment of the device for carrying out the method, provision is made for two identical capacitive storage chains C3 and C4 instead of the single chain C2, there being recorded on the chain C3 the N samples of one series in the form of an excess charge in the N capacitors of the chain C3 and the N samples of the other series in the form of a charge defect in the N capacitors of the chain C4, the charge excesses and defects being counted from a mean biasing level. This device comprises N pairs of transistors T4 and T5 which are driven on the gate by the voltage at the terminals of the capacitor of one element of C3 in the case of the transistor T4 and by the voltage at the terminals of the corresponding capacitor of the element of the chain C4 in the case of the transistor T5, said transistors T4 and T5 being supplied in parallel from the current generator formed by the transistors T1 and T2. Said generator delivers a current which is proportional to the information stored in one of the elements of the chain C1, with the result that the difference in the currents which flow through the transistors T4 and T5 is proportional to the product of the data to be multiplied. Provision is additionally made for two identical resistors R1 and R2 such that all the drains of the N transistors T4 are connected to the resistor R1 and all the drains of the N transistors T5 are connected to the resistor R2; a measurement is taken of the difference in voltage at the terminals of the resistors R1 and R2 in which the sum of the currents derived from the N transistors T4 flows through the resistor R1 and the sum of the currents derived from the N transistors T5 flows through the resistor R2. The use of two chains C3 and C4 increases by one order of magnitude the signal holding time in the transient capacitive storage memories. This unit, which forms the sum of N products, can be fabricated on an integrated-circuit wafer. The unit is of small overall size, has low energy consumption and offers the possibility of computations in real time if the analog computer is incorporated at the output of the measuring instrument, the use of analog-to-digital converters being dispensed with.

It is finally noted that the chains C1 and C2 can constitute a single chain which is employed successively and differently according to whether the signals corresponding to either one series or the other are fed into each chain.

One advantageous application of the invention is the realization of threshold functions. For a number of different uses and especially in the apprenticeship classifiers employed, for example, in pattern recognition machines, it is necessary to calculate functions of the form $\Sigma\, a_i x_i$ where $x_i$ is a binary digital quatity and $a_i$ is an analog coefficient. The problem of realization of these functions has not been solved satisfactorily up to the present time.

This invention makes it possible to perform this function as follows: signals which are proportional to each of the coefficients $a_i$ are recorded in a field-effect transistor having a plurality of dielectric layers of different nature between the gate and the doped semiconductor substrate of the transistor and the logical levels are transmitted at the moment of reading onto the gates of said transistors; the transistor which is driven by the logical level 1 generates a current which is proportional to the coefficient $a_i$ which it has recorded and the transistor which is driven by the logical level 0 generates a zero current; the sum of these currents is then formed by means of a device of known type.

A clearer understanding of the invention will be gained from a perusal of the following description of one embodiment of the invention which is given by way of example without any limitation being implied, reference being made to the accompanying figures, in which.

Figure 1:
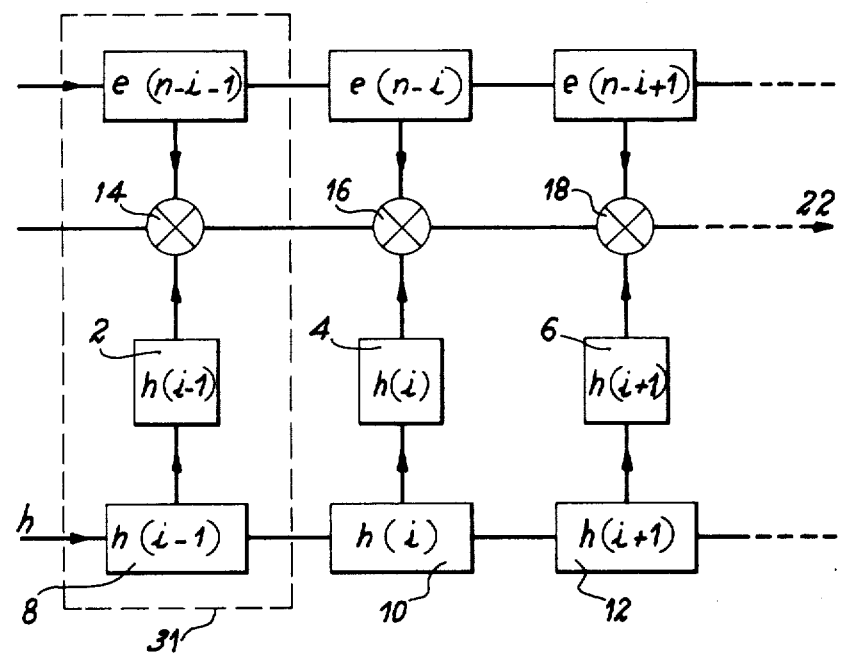
FIG. 1 is an operating diagram of a multiplier element.

The example illustrated in FIG. 1 makes use of the memory cores 2, 4, 6 comprising the MIIS transistors in which are recorded the different values of a function $h$ which has been sampled by splitting into N parts. The numerical values of said N parts are fed in series into the brigade bucket chain C1 formed by elements of the type 8, 10 and 12 and transferred in parallel into the N memory cores such as 2, 4, 6 by means of a given clock signal.

In the example of construction in which a single chain C2 is employed for the purpose of recording the different values of the samples of the function $e$, the values of $e$ are recorded in the brigade bucket chain C2, with the result that the numbered sample $n-i$ of the function $e$ corresponds to the sample $i$ of the function $h$. When a given clock signal is applied, the N products of the two corresponding elements of the functions $e$ and $h$ are formed in the multipliers such as 14, 16 and 18, the result of each multiplication in the branch 20 is then added and the final result appears at 22.

It is readily apparent that only three multiplication cells such as the cell 31 have been represented for an assembly which contains N cells.

Figure 2:
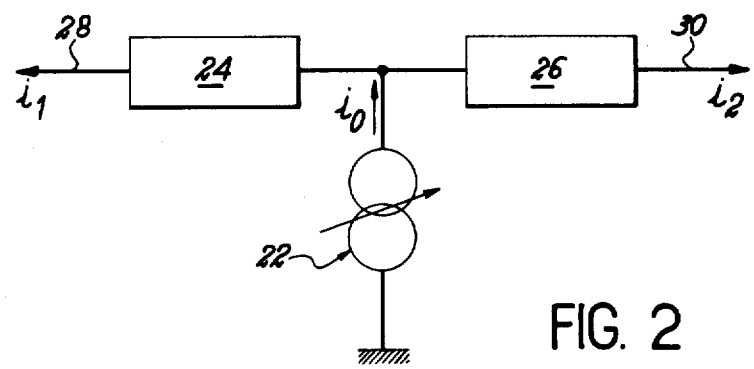
FIG. 2 is a functional diagram of the current generator.

In FIG. 2, there is shown the functional diagram of the generator which is associated with each memory element; it consists of a current generator 22 which delivers into two impedances 24 and 26 in parallel, the value of the impedance 24 being $G_0(1+k)$ and the value of the impedance 26 being $G_0(1-k)$.

The current $i_1$ flows within the branch 28 and the current $i_2$ flows within the branch 30. The sum of these currents is equal to the current $i_0$ delivered by the generator G. The difference between the currents $i_1$ and $i_2$ is equal to $k_0 I_0$. In the method corresponding to this diagram, $i_0$ is proportional to the value of the analog signal fixed in a MIIS transistor memory element and the value of $k$ is proportional to the information stored in the chain C2.

Figure 3:
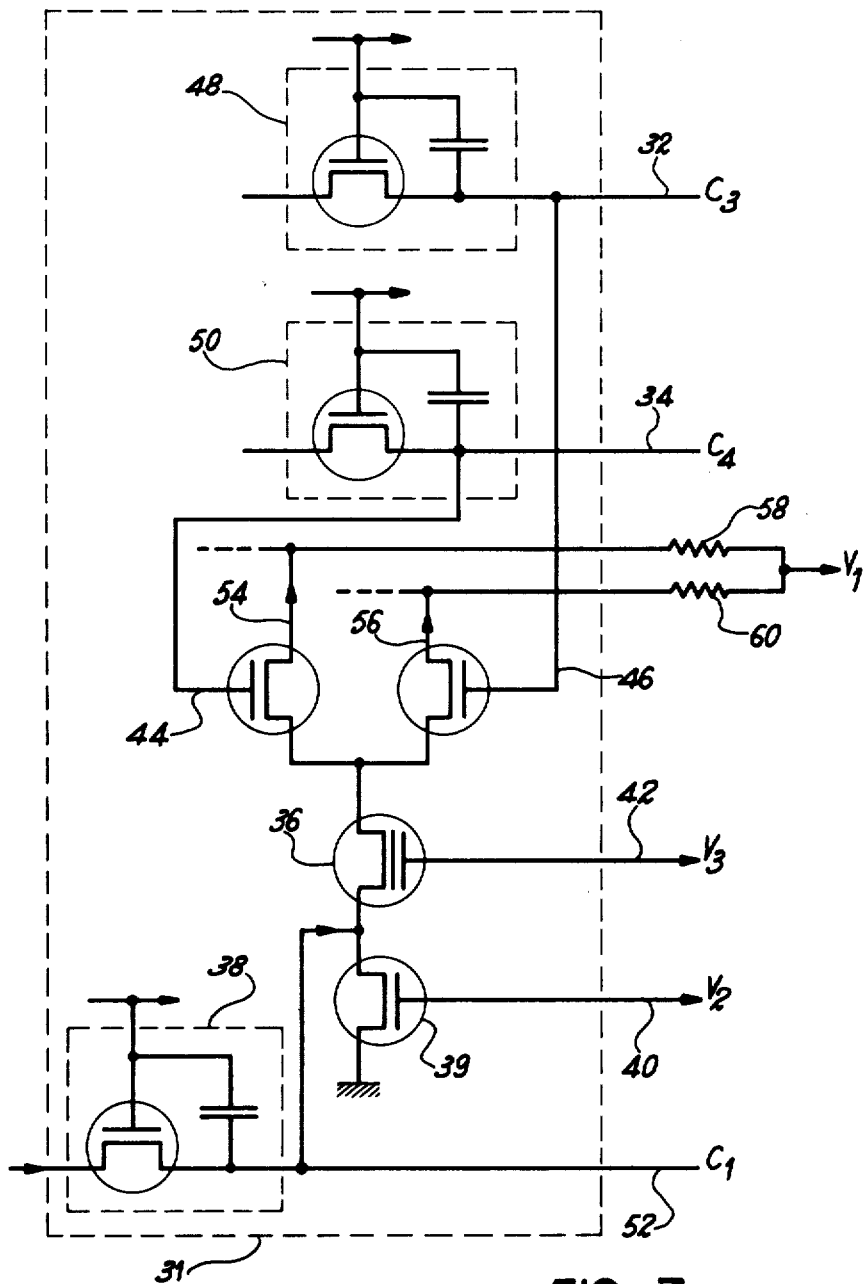
FIG. 3 is a circuit diagram of a convolutor cell.

There is shown in FIG. 3 a circuit diagram of a multiplication cell 31 with two memory elements of the brigade bucket chain type C3 and C4 as designated by the references 32 and 34. The MIIS transistor T1 shown at 36 fixes the information stored in the element 38 of the chain C1. The transistor T2 which is shown at 39 and the characteristics of which are chosen so as to operate in the ohmic region can be driven by a voltage V2 applied to its gate at 40. A voltage V3 is applied to the gate 42 of the transistor T1. The gate 44 of the transistor T3 and the gate 46 of the transistor T4 are supplied by the signals which are recorded by the two elements of the chains C3 and C4. These signals are constituted by a bias voltage which is identical in both chains and on which is superimposed in one case the value of the information recorded in the element 48 of the chain C3 and in the other case the value of the information recorded in the element 50 of the chain C4. These two recorded values are equal but of opposite sign. The transistors T3 and T4 operate in the ohmic region so that the difference between the respective values of their conductance is proportional to the difference between the gate voltages applied to each transistor, said difference being in turn proportional to the value of the signal recorded in the elements 48 and 50. The MOS transistors T3 and T4 constitute a practical embodiment of the two variable resistances 24 and 26 which were described with reference to FIG. 2. This differential structure minimizes signal losses in the chains C3 and C4 as well as the effects of dispersion of the threshold voltages in the transistors T3 and T4.

The sequence of operation of a multiplier element is as follows:

1. There is applied to the transistor T1 at 42 a voltage pulse of given amplitude and of sufficient duration to saturate the structure by trapping (the operation which consists in zero-resetting of the memory core).

2. The N samples of the function $h$ in series are recorded on the chain C1. To this end, the transistor T1 is electrically insulated from the remainder of the circuit, the chains C3 and C4 are out of service, and the transistors T3 and T4 are in the cut-off state as is also the case with the transistor T2 since $V_2 = 0$ is imposed.

3. A pulse 42 is applied to the gate of the transistor T1 and said pulse which is calibrated both in time and in amplitude transfers to the untrapping the information which is contained in the memory element 38 of the chain C1 in the MIIS transistor T1.

4. The data corresponding to the sampling of the function $e$ are then fed through the chains C3 and C4 onto the memory cores, in particular the cores 48 and 50.

5. A constant voltage is applied to the gate 42 of the transistor T1 and this latter then delivers a current which is a linear function of the stored information.

All the drains 54 of the transistors T3 and all the drains 56 of the transistors T4 are connected and supplied through the two resistors R1, 58 and R2, 60. The final signal is obtained by calculating the difference between the resultant voltages within the resistors R1 and R2 with a comparator of known type which is not shown in the figure.

What we claim is:

1. A method for storing analog signals in integrated circuit memory elements, wherein the memory elements are constituted by field-effect transistors having a number of layers of different dielectrics between the gate and the doped semiconductor substrate of the transistor, comprising the steps of performing a discrete sampling of an analog signal at N points, applying N writing voltages having values which are proportional to those of each point of the sampled signal to be recorded between the gate and the inversion channel of the multiple dielectric layer transistors which constitute said memory elements, the value of the analog signal at N points being stored in the form of a corresponding threshold voltage in each of said transistors.

* * * * *